US006731154B2

United States Patent
Bednar et al.

(10) Patent No.: US 6,731,154 B2
(45) Date of Patent: May 4, 2004

(54) GLOBAL VOLTAGE BUFFER FOR VOLTAGE ISLANDS

(75) Inventors: Thomas Richard Bednar, Essex Junction, VT (US); Scott Whitney Gould, South Burlington, VT (US); David E. Lackey, Jericho, VT (US); Douglas Willard Stout, Milton, VT (US); Paul Steven Zuchowski, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/063,504

(22) Filed: May 1, 2002

(65) Prior Publication Data

US 2003/0206051 A1 Nov. 6, 2003

(51) Int. Cl.⁷ .............................................. H03K 17/06
(52) U.S. Cl. ..................................... 327/383; 327/333
(58) Field of Search ............................ 327/564, 565, 327/530, 333, 383

(56) References Cited

U.S. PATENT DOCUMENTS

| 5,157,635 | A | * | 10/1992 | Ellis et al. ............. 365/230.06 |
| 5,422,915 | A | * | 6/1995 | Byers et al. ................. 375/357 |
| 5,608,275 | A | * | 3/1997 | Khosrowpour ............... 307/130 |
| 6,008,636 | A | * | 12/1999 | Miller et al. .............. 324/158.1 |
| 6,060,946 | A | * | 5/2000 | Harima et al. .............. 327/551 |
| 6,098,128 | A | * | 8/2000 | Velez-McCaskey et al. .. 710/65 |
| 6,128,746 | A | * | 10/2000 | Clark et al. ................. 713/324 |
| 6,166,580 | A | * | 12/2000 | Sessions ..................... 327/333 |
| 6,195,754 | B1 | * | 2/2001 | Jardine et al. .............. 713/324 |
| 6,472,903 | B1 | * | 10/2002 | Veenstra et al. .............. 326/38 |
| 6,487,102 | B1 | * | 11/2002 | Halbert et al. ................ 365/51 |
| 6,538,314 | B1 | * | 3/2003 | Buffet et al. ................. 257/691 |
| 6,631,502 | B2 | * | 10/2003 | Buffet et al. ................... 716/4 |

* cited by examiner

*Primary Examiner*—Timothy P. Callahan
*Assistant Examiner*—Cassandra Cox
(74) *Attorney, Agent, or Firm*—Richard A. Henkler

(57) ABSTRACT

A method and apparatus for buffering a signal in a voltage island that is in standby or sleep mode. The apparatus uses a buffer(s) that are powered from a global power supply voltage that is always powered, and such buffer(s) are placed within the sleeping island itself. The sleeping island can be at the same or different voltage from the global voltage.

7 Claims, 2 Drawing Sheets

GLOBAL VOLTAGE BUFFER FOR VOLTAGE ISLANDS

BACKGROUND OF THE INVENTION

1. Technical Field of the Present Invention

The present invention generally relates to voltage islands, and more specifically, to methods and apparatuses that transmit signals across such voltage islands.

2. Description of Related Art

The semiconductor industry is constantly increasing the number of circuits and functionality that can be compressed onto a single die. As process dimensions decrease, this ability has grown at an astronomical rate. The ability to put entire functioning systems on a single die is now the norm rather than the exception. As a consequence of this growth, the die/integrated circuit can be viewed as compilation of functioning islands.

Some of these islands operate at different voltages from one another, others have the ability to switch to standby or sleep mode, while still others result from the need to isolate noisy circuitry. The ability to combine these different islands onto a single integrated circuit, requires techniques and circuitry for propagating communication (clocks, signals, etc), power, and output results.

One problem associated with these types of voltage islands, results from the ability to put various islands in standby or sleep mode ("sleeping island"). The problem arises when a signal not associated with the sleeping island must cross the sleeping island. More specifically, when the sleeping island is large enough in size such that buffering is required to improve the signal for noise and/or performance reasons. Obviously, the buffering could occur outside the sleeping island, but this is not always desirable.

It would, therefore, be a distinct advantage if the buffering of such a signal could occur within the sleeping voltage island itself. The present invention provides such a method and apparatus.

BRIEF SUMMARY OF THE INVENTION

The present invention is a method and apparatus for buffering a signal in a voltage island that is in standby or sleep mode. The apparatus uses a buffer(s) that are powered from a global power supply voltage that is always powered, and such buffer(s) are placed within the sleeping island itself. The sleeping island can be at the same or different voltage from the global voltage.

BRIEF DESCRIPTION OF THE SEVERAL VIEWS OF THE DRAWINGS

The present invention will be better understood and its numerous objects and advantages will become more apparent to those skilled in the art by reference to the following drawings, in conjunction with the accompanying specification, in which.

DETAILED DESCRIPTION OF THE INVENTION

Detailed Description of the Preferred Embodiment of the Present Invention

For the most part, details concerning timing considerations and the like have been omitted inasmuch as such details are not necessary to obtain a complete understanding of the present invention, and are within the skills of persons of ordinary skill in the relevant art.

A voltage island as used herein denotes a group or set of circuit elements powered from the same voltage source, the power bus structure needed to distribute the voltage source to the circuits, any functions needed to generate or switch the voltage source (e.g. on-chip regulators or header switches), and any control elements needed to perform clock and power management, state saving, power sensing, and stable input or output values during voltage changes.

Figure 1:
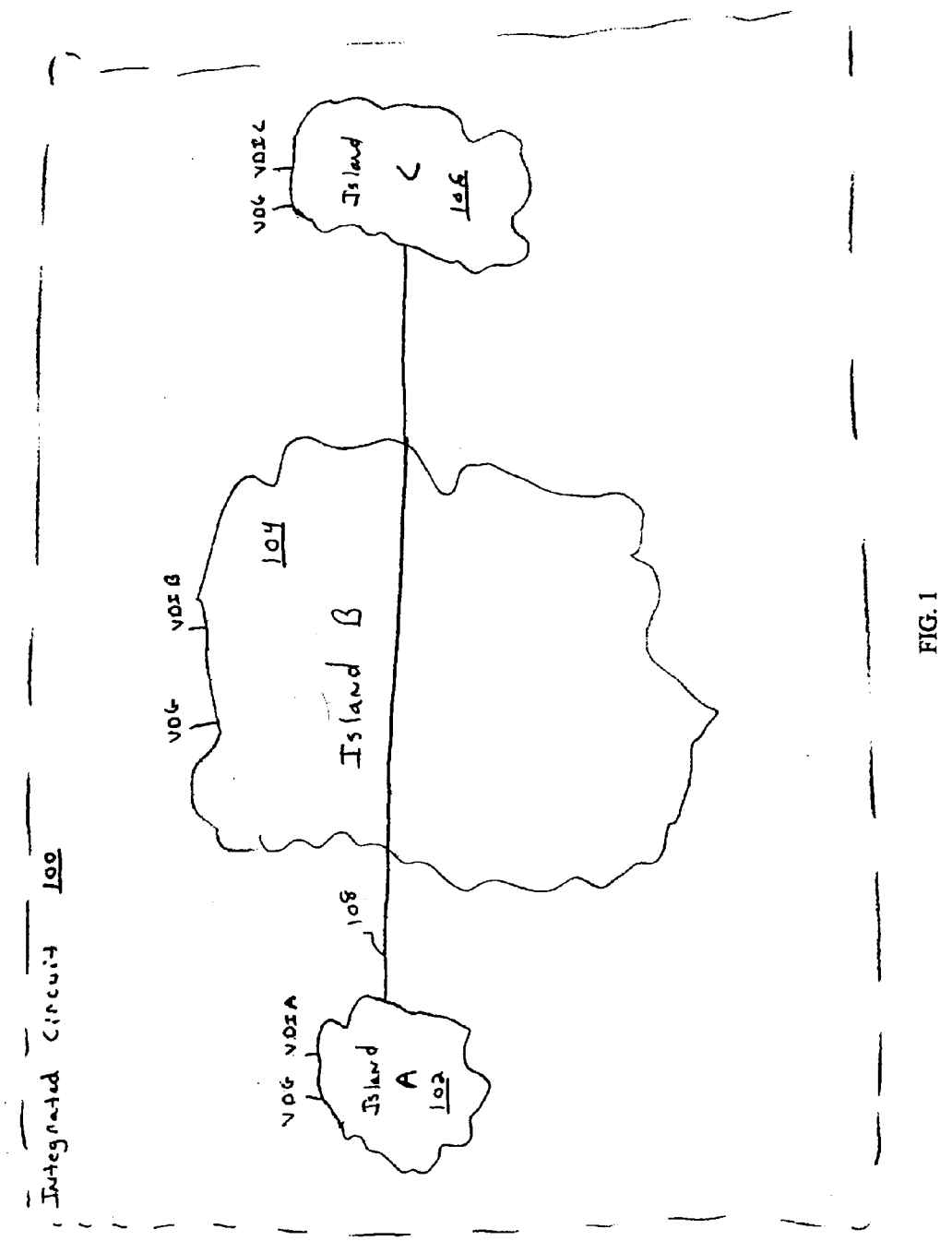
FIG. 1 is a schematic diagram illustrating an example of an integrated circuit 100 constructed according to the teachings of the present invention.

FIG. 1 is a schematic diagram illustrating an example of an integrated circuit 100 constructed according to the teachings of the present invention. Integrated circuit 100 includes 3 voltage islands (A 102, B 104, and C 106), as defined above, and a communication line 108. Integrated circuit 100 has been illustrated as having three islands for ease of explanation and is not intended as a limitation on the present invention, and in fact, the number of voltage islands can be numerous (e.g. over 100).

Each of the voltage islands A 102, B 104, and C 106 are powered with a global voltage supply (VDG) and a voltage island voltage supply VDIA, VDIB, and VDIC, respectively. VDIA, VDIB, or VDIC can be of the same or different levels from one another or VDG.

In this example, voltage island B 104 has the ability to switch to sleep or standby mode (i.e. where substantially all of the circuitry within Voltage island B 104 goes to approximately zero volts).

As illustrated, voltage island A 102 is attempting to communicate with voltage island C 106 via communication line 108 through voltage island B 104.

Voltage island B 104 is sufficient in size to cause communication line 108 to exceed the maximum allowed unbuffered wire length for a particular chip technology (e.g. 0.13 micrometer) due to performance or noise constraints in crossing over island B 104. Consequently, communication line 108 must be buffered either outside of the Voltage island B 104, or in accordance with the teachings of the present invention, within the Voltage island B 104 itself as explained in connection with FIG. 2.

Figure 2:
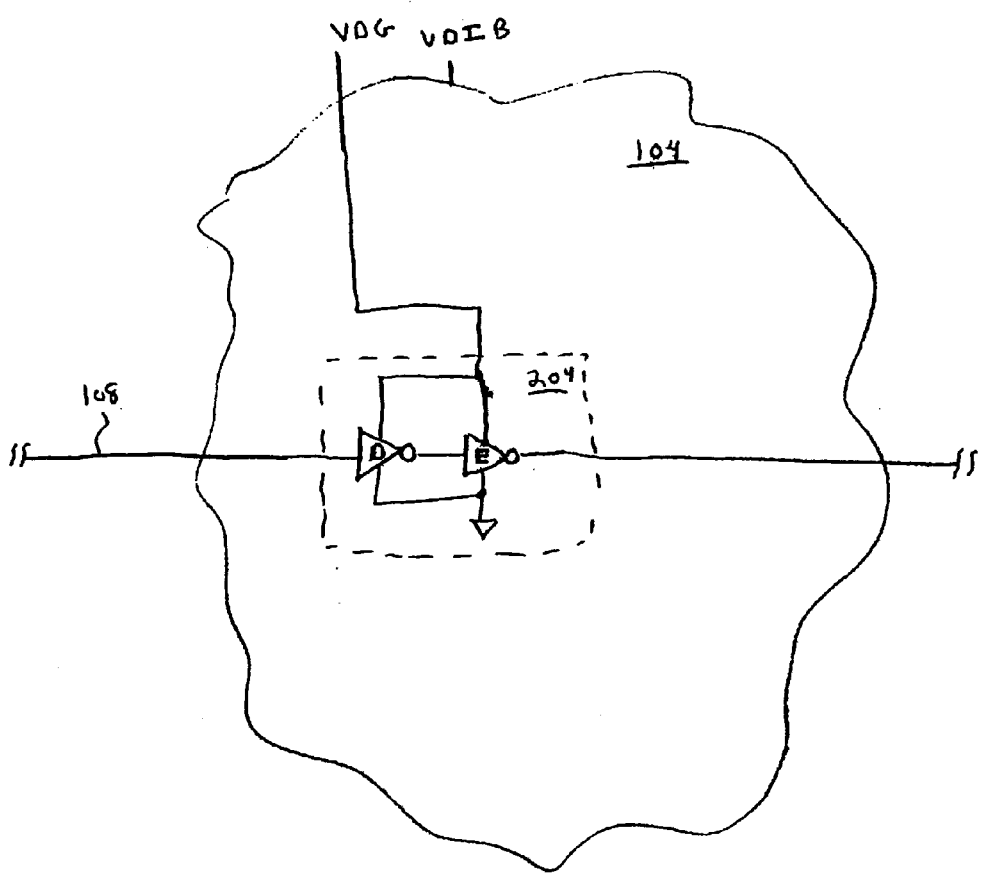
FIG. 2 is a schematic diagram illustrating in greater detail the buffer circuit as it resides within voltage island B of FIG. 1 in accordance with the teachings of the present invention.

FIG. 2 is a schematic diagram illustrating in greater detail the buffer circuit 204 as it resides within voltage island B 104 in accordance with the teachings of the present invention. Voltage island 104 includes a buffer circuit 204 which is powered from the global power supply VDG. For purposes of illustration only, buffer circuit 204 has been illustrated as including two invertors D and E. The buffer circuit 204 can take any form provided it supplies adequate signal redrive to any signals crossing the voltage island B 104, and is powered from the global power supply VDG (i.e. the buffer 204 remains powered when VDI 208 is turned off or approaching zero volts).

It is thus believed that the operation and construction of the present invention will be apparent from the foregoing description. While the method and system shown and described has been characterized as being preferred, it will be readily apparent that various changes and/or modifications could be made wherein without departing from the spirit and scope of the present invention as defined in the following claims.

What is claimed is:

1. An apparatus far providing communication in an integrated circuit, the apparatus comprising:
   a global power source;
   a first set of circuits providing a first function;
   a second set of circuits providing a second function and capable of being powered off;
   a third set of circuits providing a third function;
   a communication line for providing communication between the first and third set of circuits, the communication line crossing through the second set of circuits; and
   a buffer, located within the second set of circuits, coupled to the communication line and capable of being powered on while the second set of circuits is powered off for providing signal redrive.

2. The apparatus of claim 1 wherein the second set of circuits are powered from a power source that is different from that the global power source.

3. The apparatus of claim 2 wherein the buffer is powered from the global power source.

4. The apparatus of claim 3 wherein the third set of circuits are powered from a power source that is different from that of the first and second set of circuits.

5. An integrated circuit comprising:
   a global power source;
   a first power source capable of being turned off;
   a communication line for providing communication of signals;
   a first group of circuits for performing a first function, the first group of circuits using the communication line for communicating signals;
   a second group of circuits for performing a second function, the second group of circuits being powered from the first power source;
   a buffer, located within the second group of circuits and powered from the global power source, for redriving signals transmitted on the communication line; and
   a third group of circuits for performing a third function, the third group of circuits receiving via the communication line the communication signals sent by the first group of circuits.

6. The integrated circuit of claim 5 further comprising:
   a second power source; and
   a third power source.

7. The integrated circuit of claim 6 wherein the first group of circuits are powered by the second power source, and the third group of circuits are powered by the third power source.

* * * * *